a2

United States Patent
Tzu et al.

(10) Patent No.: US 9,783,889 B2
(45) Date of Patent: Oct. 10, 2017

(54) APPARATUS FOR VARIABLE SUBSTRATE TEMPERATURE CONTROL

(75) Inventors: Gwo-Chuan Tzu, Sunnyvale, CA (US); Xiaoxiong Yuan, San Jose, CA (US); Amit Khandelwal, San Jose, CA (US); Avgerinos V. Gelatos, Redwood City, CA (US); Olkan Cuvalci, Sunnyvale, CA (US); Kai Wu, Palo Alto, CA (US); Michael P. Karazim, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1534 days.

(21) Appl. No.: 13/430,278

(22) Filed: Mar. 26, 2012

(65) Prior Publication Data

US 2013/0247826 A1    Sep. 26, 2013

(51) Int. Cl.
| C23C 16/458 | (2006.01) |
| C23C 16/46 | (2006.01) |
| C23C 16/455 | (2006.01) |
| C23C 16/48 | (2006.01) |
| C23C 16/52 | (2006.01) |

(52) U.S. Cl.
CPC .......... C23C 16/46 (2013.01); C23C 16/4583 (2013.01); C23C 16/4585 (2013.01); C23C 16/4586 (2013.01); C23C 16/45565 (2013.01); C23C 16/481 (2013.01); C23C 16/52 (2013.01)

(58) Field of Classification Search
CPC ......... H01L 21/68735; H01L 21/68721; H01L 21/68742; C23C 16/4585; C23C 16/45521; H01J 37/32715; H01J 37/32724
USPC ............................... 156/345.3; 118/721, 725
See application file for complete search history.

(56) References Cited

U.S. PATENT DOCUMENTS

| 6,186,092 | B1 * | 2/2001 | Tsai et al. ................. 118/728 |
| 6,828,243 | B2 | 12/2004 | Denpoh |
| 7,658,816 | B2 | 2/2010 | Koshiishi et al. |
| 8,043,472 | B2 | 10/2011 | Miyagawa et al. |
| 2002/0046810 | A1 * | 4/2002 | Tanaka et al. ........... 156/345.51 |
| 2006/0231031 | A1 * | 10/2006 | Dings et al. .............. 118/723 R |

(Continued)

FOREIGN PATENT DOCUMENTS

JP       2002-164323 A      6/2002

OTHER PUBLICATIONS

International Search Report and Written Opinion mailed Feb. 9, 2012 for PCT Application No. PCT/US2011/042125.

*Primary Examiner* — Karla Moore
*Assistant Examiner* — Margaret D Klunk
(74) *Attorney, Agent, or Firm* — Moser Taboada; Alan Taboada (57) ABSTRACT

In some embodiments, an apparatus for variable substrate temperature control may include a heater moveable along a central axis of a substrate support; a seal ring disposed about the heater, the seal ring configured to interface with a shadow ring disposed above the heater to form a seal; a plurality of spacer pins configured to support a substrate and disposed within a plurality of through holes formed in the heater, the plurality of spacer pins moveable parallel to the central axis, wherein the plurality of spacer pins control a first distance between the substrate and the heater and a second distance between the substrate and the shadow ring; and a resilient element disposed beneath the seal ring to bias the seal ring toward a backside surface of the heater.

20 Claims, 9 Drawing Sheets

(56) References Cited

U.S. PATENT DOCUMENTS

2009/0067954 A1* 3/2009 Lanee et al. ................. 414/172
2012/0003388 A1 1/2012 Tzu et al.

* cited by examiner

APPARATUS FOR VARIABLE SUBSTRATE TEMPERATURE CONTROL

FIELD

Embodiments of the present invention generally relate to apparatus for semiconductor processing.

BACKGROUND

Conventional process chambers configured to perform thermal based processes such as depositions processes (e.g., atomic layer deposition (ALD), chemical vapor deposition (CVD), or the like) provide fixed heater temperatures. The inventors have observed that fixed heater temperatures limit process capabilities, for example, limiting the ability to tune certain process parameters during processing, thus making the process inflexible.

Therefore, the inventors have provided an improved apparatus capable of providing variable substrate temperature control.

SUMMARY

Apparatus for variable substrate temperature control are provided herein. In some embodiments, an apparatus for variable substrate temperature control may include a heater moveable along a central axis of a substrate support; a seal ring disposed about the heater, the seal ring configured to interface with a shadow ring disposed above the heater to form a seal; a plurality of spacer pins configured to support a substrate and disposed within a plurality of through holes formed in the heater, the plurality of spacer pins moveable parallel to the central axis, wherein the plurality of spacer pins control a first distance between the substrate and the heater and a second distance between the substrate and the shadow ring; and a resilient element disposed beneath the seal ring to bias the seal ring toward a backside surface of the heater.

In some embodiments, a processing system may include: a processing chamber having an inner volume; an inlet to provide a process gas to the inner volume; an exhaust disposed in the inner volume to facilitate removal of one or more gases from the process chamber; a substrate support disposed in the inner volume and below the inlet, wherein the substrate support further comprises: a heater moveable along a central axis of the substrate support; a seal ring disposed about the heater, the seal ring configured to interface with a shadow ring disposed above the heater to form a seal; a plurality of spacer pins configured to support a substrate and disposed within a first set of a plurality of through holes formed in the heater, the plurality of spacer pins moveable parallel to the central axis of the substrate support, wherein the plurality of spacer pins control a first distance between the substrate and the heater and a second distance between the substrate and the shadow ring; and a resilient element disposed beneath the seal ring to bias the seal ring toward a backside surface of the heater.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for variable substrate temperature control are provided herein. The inventive apparatus may advantageously provide a substrate support that allows for the height of a heater to be controlled in relation to the substrate and/or other components of the process chamber to provide variable substrate temperature process capability. The inventors have discovered that providing variable temperature processing capability may increase process tuning parameters, enhance flexibility of the process and resultant product and provide a more robust process without adding significant cost. Although not limiting in scope, the inventors have observed that the inventive apparatus may be particularly beneficial in process chambers configured for single chamber thermal based processes, such as depositions processes (e.g., atomic layer deposition (ALD), chemical vapor deposition (CVD), or the like). For example, the inventive apparatus may be beneficial in an ALD process utilized to deposit a metal (e.g., tungsten (W)) on a substrate.

Figure 1:
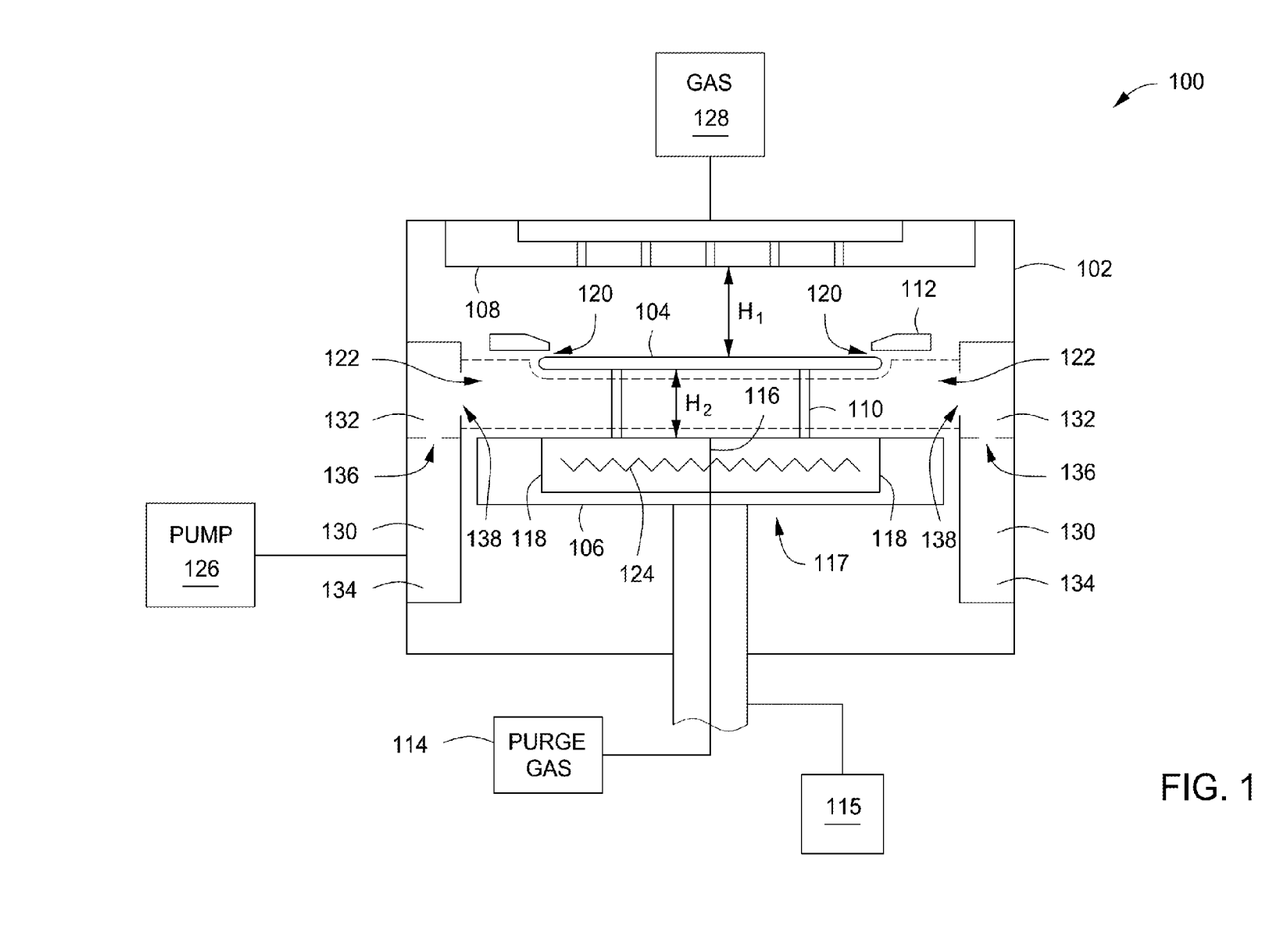
FIG. 1 is a schematic side view of a substrate processing system in accordance with some embodiments of the present invention.

FIG. 1 is a schematic side view of a substrate processing system 100 in accordance with some embodiments of the present invention. The substrate processing system 100 may generally include a process chamber 102 for processing a substrate 104 therein. The process chamber 102 may be any type of process chamber 102 suitable for processing substrates, for example, such as a deposition chamber. An exemplary CVD or ALD process chamber may include the SPRINT™ ALD/CVD process chamber or other process chambers, available from Applied Materials, Inc. of Santa Clara, Calif. Other suitable process chambers may similarly be used.

The process chamber 102 may be configured to control the position of the substrate 104 within the process chamber 102 such that one or more of a first height h1 and a second height h2 may be controlled. The first height, h1, is defined between a frontside of the substrate 104 and a showerhead 108 disposed in the process chamber 102 above the substrate 102 (or a ceiling of the process chamber 102 when no showerhead is present). The second height, h2, is defined between a backside of the substrate 104 and a heater 106. Although the heater 106 is shown as a resistive element 124 incorporated into a substrate support pedestal 117, other geometries or heating mechanisms, such as radiative lamps, may be used alternatively or in combination. For example, in some embodiments, the heater 106 may be replaced with just a substrate support pedestal and the substrate 104 may be heated by another heater, not shown. When present, the height of the heater 106 relative to the showerhead 108 and/or substrate 104 may be controlled by a heater lift mechanism 115.

The showerhead 108 may be coupled to a process gas source 128 for providing one or more process gases for carrying out processes in the process chamber 102. For example, in some embodiments, the process chamber 102 may be configured for deposition processes such as ALD or CVD processes for applications such as the deposition of, in a non-limiting example, tungsten or tungsten-containing materials. Alternatively or in combination, other gas inlets may be provided to introduce and distribute process gases into the process chamber 102, such as nozzles or inlets disposed about the process chamber 102, in the ceiling of the process chamber, and/or within the process chamber about the substrate 104, or the like.

The substrate 104 may be supported above the heater 106 by any suitable means, such as a plurality of substrate spacer pins 110. The spacer pins 110 may rest atop the heater 106, or may be disposed in or through the heater 106. The spacer pins 110 may be positionable to control the height of the substrate 104 above the heater 106 (e.g., h2) and the height between the substrate 104 and the showerhead 108 (e.g., h1), for example, as described below. The heater 106 may also be vertically positionable to move between various processing positions within the process chamber 102. For example, the heater 106 may be movable at least between a lower position for loading and unloading the substrate 104, such as through an opening (not shown) formed in the side of the process chamber 102, and an upper position for processing the substrate 104. In some embodiments, the heater 106 may be movable at various discrete points or continuously between the lower and upper positions.

The position of the substrate 104 within the chamber may be controlled via the position of the heater 106 (or substrate support pedestal), and the length that the spacer pins 110 extend above the upper surface of the heater 106. The heater 106 and the spacer pins 110 may be positioned such that the substrate 104 is spaced at a first distance (e.g., h1) from the ceiling or showerhead 108 and at a second distance (e.g., h2) from the heater 106.

The process chamber 102 further includes an exhaust 130 coupled to a pump 126 for removing process gases, purge gases, processing byproducts, and the like from the process chamber 102, for example, via one or more openings 138 fluidly coupling the processing region of the process chamber 102 with the exhaust 130. In some embodiments, the exhaust 130 may be disposed about the walls of the process chamber 102 and may further be split into an upper exhaust 132 and a lower exhaust 134 with one or more openings 136 disposed between the upper and lower exhaust 132, 134 to control the flow of the process gases, etc., through the exhaust 130 and to the pump 126 (e.g., to provide more azimuthally uniform flow from the processing region of the process chamber above the substrate to the exhaust 130 due to the asymmetric pump configuration).

A non-contact shadow ring (shadow ring) 112 may be disposed over a frontside of the substrate 104 proximate the edge of the substrate 104 and the frontside of substrate 104. The position of the shadow ring 112 may be controlled to control the size of a first gap 120 defined between the frontside of the substrate 104 and the shadow ring 112 (i.e., the shadow ring 112 does not contact the substrate). The position of the shadow ring 112 may be controlled by any suitable means, such as by mechanically holding or supporting the shadow ring 112 on other components of the process chamber 102 (not shown in FIG. 1).

A purge gas, for example an inert gas, such as argon, may be provided by a purge gas source 114 to a purge gas passageway 122 defined between a backside of the substrate 104 and the exhaust 130 of the process chamber 102 (approximated in dashed lines in FIG. 1). A conduit 116 may be provided through the heater 106 to provide the purge gas to the purge gas passageway 122 proximate a central axis of the substrate 104. One or more second conduits 118 may be provided to deliver the purge gas proximate the edge of the substrate 104.

The size of the first gap 120 between the shadow ring 112 and the substrate 104 may be controlled in combination with the size of one or more second gaps in the purge gas passageway 122 such that a positive flow of the purge gas is provided through the first gap 120, for example, as described below.

Figure 2:
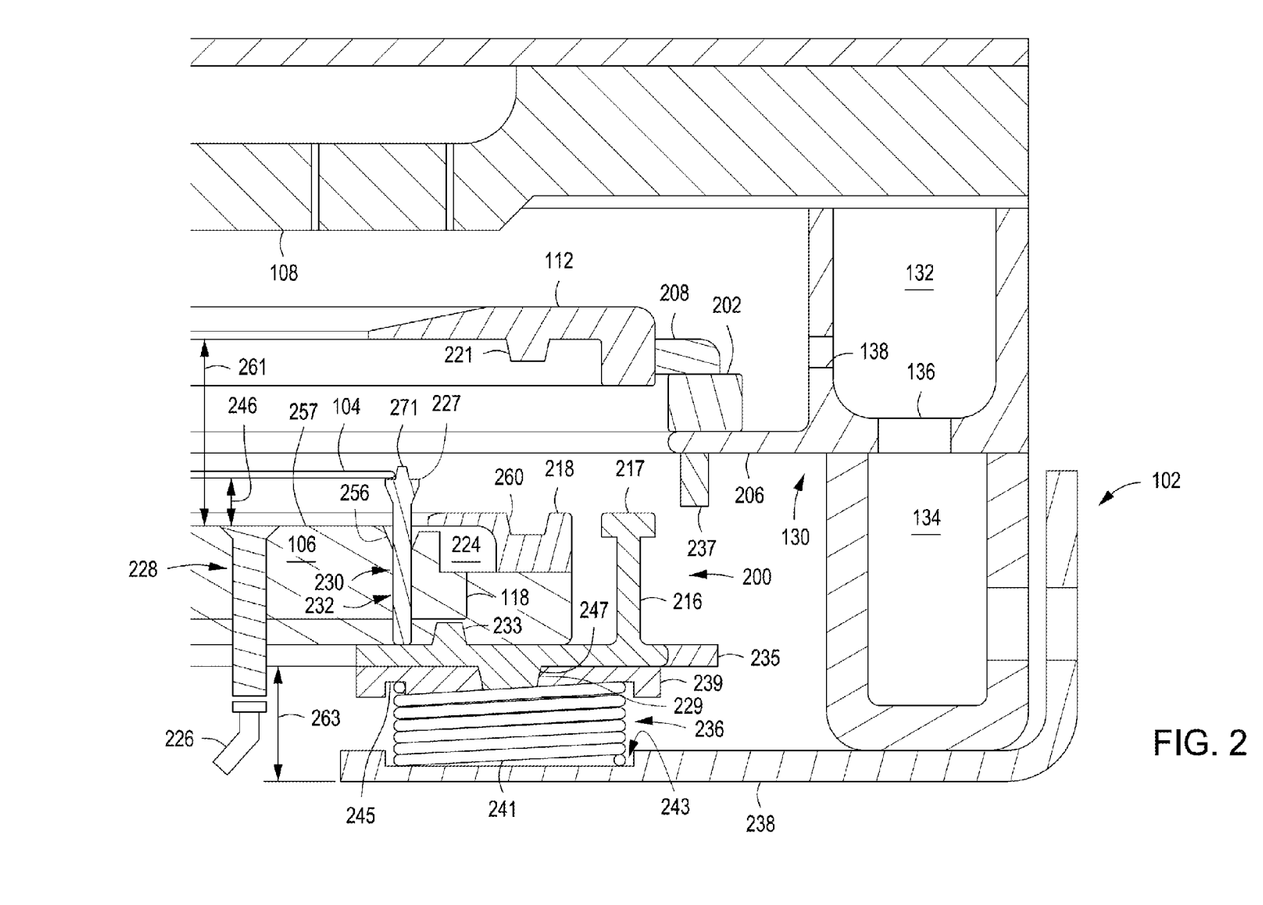
FIGS. 2-9 depict a portion of a process chamber having an apparatus for variable substrate temperature control in accordance with some embodiments of the present invention.

Referring to FIG. 2, in some embodiments, the exhaust 130 may include an inwardly extending flange 206. An outer ring 202 may be disposed on the inwardly extending flange 206. The shadow ring 112 may have a plurality of outwardly extending tabs 208 that rest on corresponding shelves or other surfaces within the process chamber, for example, the outer ring 202. In some embodiments, the shadow ring 112 may comprise one or more protrusions (one protrusion 221 shown) configured to interface with a feature 260 of a purge ring 218 disposed atop the heater 106 to facilitate centering the shadow ring 112 and heater 106 when the heater 106 is raised (e.g., as described below).

The inventors have observed that in conventional process chambers configured to perform thermal based processes such as deposition processes (e.g., atomic layer deposition (ALD), chemical vapor deposition (CVD), or the like) fixed heater temperatures limit process capabilities. The inventors have discovered that providing variable temperature processing capability may increase process tuning parameters, enhance flexibility of the process and resultant product and provide a more robust process without adding significant cost. For example, in an atomic layer deposition process utilized to deposit a metal (e.g., tungsten (W)) having variable temperature process capability may facilitate a low temperature nucleation to provide lower fluorine and improved nucleation coverage while also facilitating a high temperature bulk fill to provide higher productivity. The inventors have also discovered that controlling the height of a heater within the process chamber (e.g., heater 106) in relation to the substrate (e.g., substrate 104) and/or other components of the process chamber (e.g., shadow ring 208, showerhead 108, or the like) may provide the above discussed variable temperature process capability.

Accordingly, in some embodiments, a substrate support 200 may generally comprise a moveable heater 106, a lower seal ring 216, and a plurality of spacer pins 232 disposed through the moveable heater 106 and configured to support the substrate 104.

In some embodiments, the purge ring 218 may provide a portion of, or is coupled to, the purge gas conduit 118 to deliver the purge gas through an opening 224 proximate the edge of the substrate 104. However, the inventors have observed that an opening between the purge ring 218 and the outer ring 202 may be large enough to allow most or all of the purge gas to flow therethrough rather than proximate the substrate 104. Accordingly, in some embodiments, the lower seal ring 216 may be configured to contact a portion of the shadow ring 112, thereby creating a seal between the opening 224 and the shadow ring 112. In such embodiments, the lower seal ring 216 may comprise an upper portion 217 having a flared edge or other configuration to provide an increased surface area to interface with the shadow ring 112, thereby facilitating the seal between the opening 224 and the shadow ring 112. The inventors have observed that by providing the seal between the opening 224 and the shadow ring 112, the purge gas is forced to flow proximate the back side of the substrate, thereby reducing or eliminating instances of film deposition on the substrate bevel or backside of the substrate.

In some embodiments, the lower seal ring 216 may comprise one or more protrusions (one protrusion shown) configured to interface with a feature 233 formed within the heater 106 to facilitate centering the lower seal ring 216 and heater 106 with respect to one another. In some embodiments, the lower seal ring 216 may comprise one or more extensions or tabs (one tab 235 shown) configured to interface with an extension 237 protruding from the inwardly extending flange 206 of the exhaust 130 to prevent the lower seal ring 216 to travel above a predetermined height when raised.

In some embodiments, a resilient element 236 may be disposed beneath the lower seal ring 216 and supported by a portion of the process chamber 102 (e.g. a wall 238). When present, the resilient element 236 provides an upward force on the lower seal ring 216, causing the lower seal ring 216 to remain in contact with the heater bottom to facilitate providing the aforementioned seal. Any amount of resilient elements 236 may be utilized to provide sealing the lower seal 216 and shadow ring 112, for example such as two or more, three or more, or in some embodiments, six resilient elements.

In some embodiments, the resilient element 236 comprises a cap 239 and a spring 241. The cap 239 may comprise one or more channels (one channel 245 shown) configured to accommodate a portion of the spring 241 to maintain the spring 241 in place during use. In some embodiments, the center of the cap 239 may comprise one or more features (one feature 247 shown) configured to interface with a protrusion 229 of the lower seal ring 216 to facilitate centering the resilient element 236 with the lower seal ring 216. In some embodiments, the portion of the process chamber 102 supporting the resilient element 236 (e.g., wall 238) may be configured to accommodate the non-capped end of the spring 241 to maintain the spring 241 in position during use (for example, in a recess 247 or other feature to retain the spring 241 or other resilient element 236). The spring 241 may be any type of spring suitable to provide sufficient force to create the above described seal. For example, in some embodiments, the spring 241 may be a high temperature compression spring. In some embodiments, the spring 241 may comprise a free length of about 2.5 to about 3.5 inches, or in some embodiments, about 3.00 inches and may be compressed to about 0.35 to about 0.9 inches, or in some embodiments, about 0.75 inches.

Figure 6:
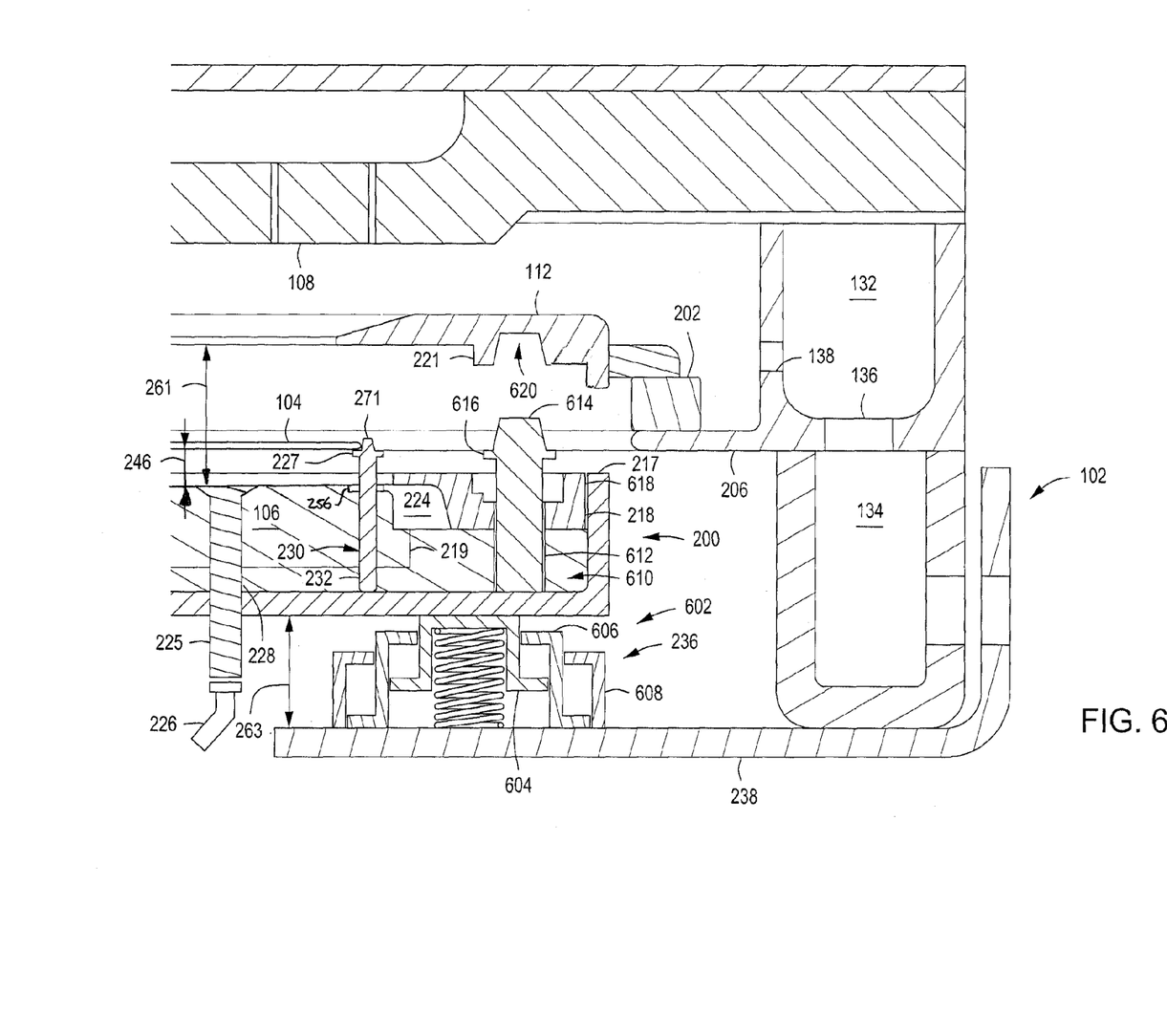

Alternatively, in some embodiments, the resilient element may include an expandable spring cover 602 having multiple telescoping sections 604, 606, 608 disposed about the resilient element 236 and configured to allow expansion of the expandable spring cover 602 when the resilient element 236 extends, for example as shown in FIG. 6.

Referring back to FIG. 2, in some embodiments, a plurality of through holes (two through holes 228, 230 shown) may be disposed through the heater 106 and configured to allow various substrate support elements to move freely through the heater 106. For example, in some embodiments a plurality of lift pins (one lift pin 225 shown, although three or more typically are used) may be disposed within one or more of the through holes 228 to facilitate providing and/or removing the substrate to the process chamber. In such embodiments, the lift pins 225 may be raised or lowered via a lift mechanism 226. In addition, in some embodiments, the plurality of substrate spacer pins (one spacer pin 232 shown) may be disposed within one or more of the through holes 230 to support the substrate 104 above the heater 106 during processing. Any amount of spacer pins 232 may be present to facilitate securely supporting the substrate 104, for example, such as three or more, or in some embodiments, about six spacer pins 232. In some embodiments, the spacer pin 232 may comprise a flange 227 to support the substrate 104 at an edge of the substrate 104. In such embodiments, the heater 106 may comprise a feature 256 configured to accommodate the flange 227 to allow the flange 227 to be recessed beneath the surface 257 of the heater 106 as the heater is raised. The spacer pin 232 may further comprise a tip 271 that extends above the flange 227. When present, the tip 271 provides a fixed distance between the top surface of the tip 271 and the top surface of the flange 227 such that elements supported by the tip 271 and the flange 227 may be spaced apart. For example, when the substrate 104 is supported by the flange and the shadow ring 112 is supported by the tip, a predefined gap may be established between the bottom surface of the shadow ring 112 and the upper surface of the substrate 104.

Alternatively, or in combination, in some embodiments, one or more alignment pins (one alignment pin 612 shown) may be disposed in one or more additional through holes (one additional through hole 610 shown) of the heater 106 and supported by the lower seal 216, such as shown in FIG. 6. When present, the one or more alignment pins 612 may facilitate aligning the shadow ring 112 with the lower seal 216 as the lower seal is raised. In some embodiments, the one or more alignment pins 612 may each comprise a flange 616 configured to rest within a notch 620 formed in the purge ring 218. In addition, the one or more alignment pins may comprise a tapered end 614 configured to interface with a similarly shaped feature 616 of the shadow ring 112.

In operation of the components described above in FIG. 2, the lower seal 216, heater 106, purge ring 218, spacer pins 232, and lift pins 225 (and alignment pins 612, when present) may be first disposed in an initial position to allow the substrate 104 to be disposed on (or, after processing, removed from) the flange 227 of the spacer pins 232, as shown in the figure. The substrate 104 may be provided via, for example, a transfer robot (not shown), to the lift pins 225 and then subsequently lowered onto the spacer pins 232 via the lift mechanism 226. In this position, the lower seal 216 may rest atop the compressed resilient element 236 and the spacer pins 232 are supported by the lower seal 216 and support the substrate 104 above the heater 106. In some embodiments, in this position, the heater 106 may be disposed at a distance 246 of about 0.1 to about 0.3 inches, or in some embodiments, about 0.160 inches from the substrate 104. In some embodiments, in this position, the heater 106 may be disposed about a distance 261 of about 1.9 to about 2.1 inches, or in some embodiments, about 1.950 inches from the shadow ring 112. In some embodiments, in this position, the heater 106 may be disposed a distance 263 of about 0.7 to about 0.9 inches, or in some embodiments, about 0.850 inches from the wall 238 of the process chamber 102.

Figure 3:
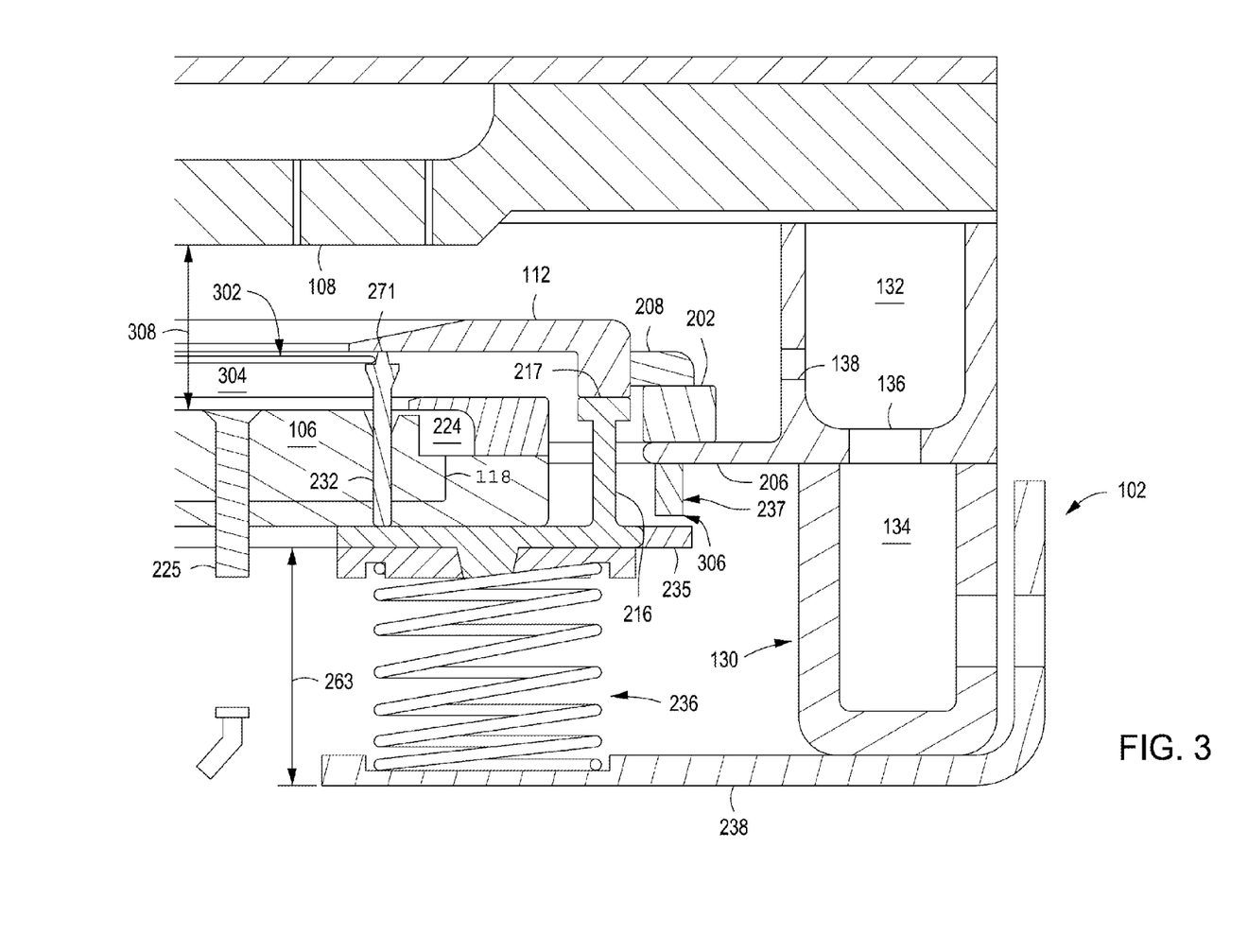
Figure 7:
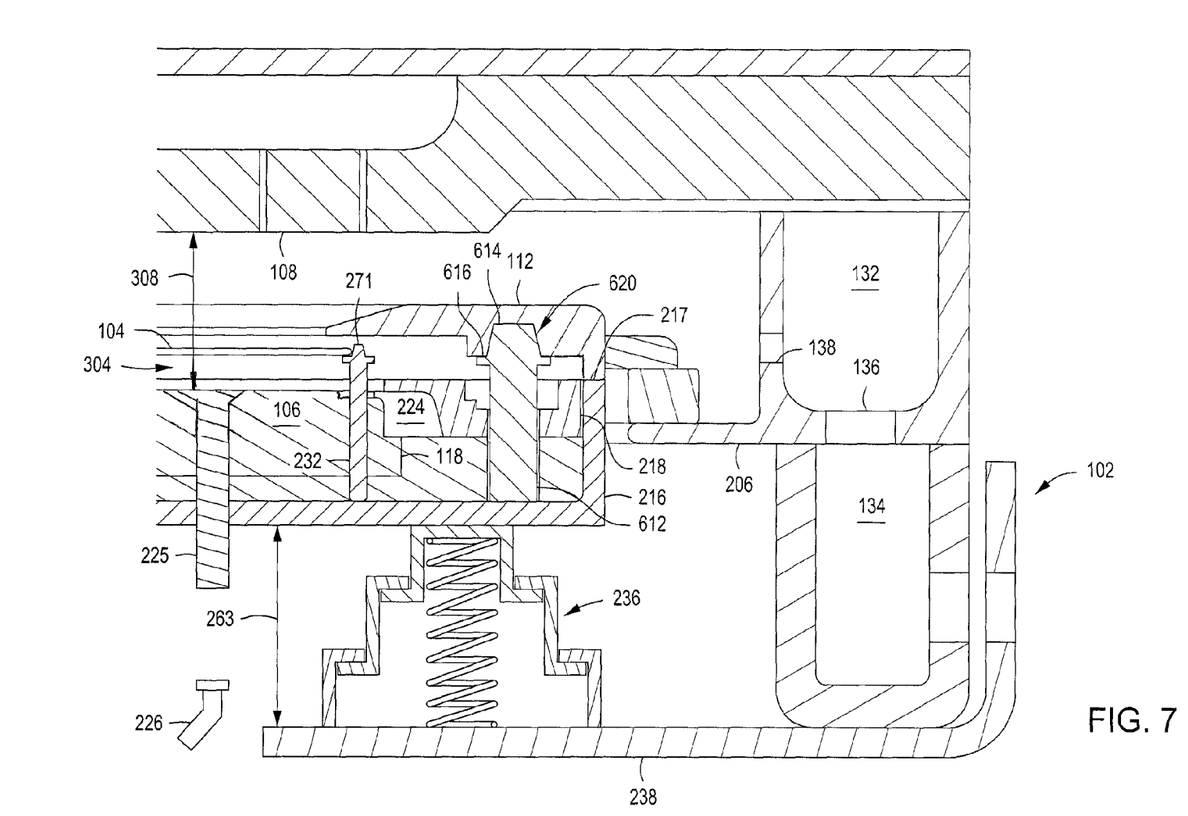

Referring to FIG. 3, as the heater 106 is raised (via, for example, the lift mechanism 115 shown in FIG. 1) from the initial position, the resilient element 236 expands, raising the lower seal 216 until the top portion 217 of the lower seal 216 contacts the shadow ring 112, thereby creating a seal between the lower seal 216 and shadow ring 112. When present, the alignment pins 612 contact the shadow ring 112 and the tapered end 614 of each of the alignment pins 612 interface with the corresponding features 620 of the shadow ring 112, such as shown in FIG. 7.

Referring back to FIG. 3, in this position, the heater 106 may be disposed at a distance 308 of about 0.750 to about 0.790 inches, or in some embodiments, about 0.790 inches, or in some embodiments, about 0.750 inches, from the showerhead 108. The seal between the lower seal 216 and shadow ring 112 is maintained by the force exerted by the resilient element 236. In addition, the tip 271 of the spacer pin 232 contacts the shadow ring 112, thereby creating a gap 302 between the substrate 104 and shadow ring 112. In some embodiments, the gap 302 may be about 0.005 to about 0.050 inches, or in some embodiments, about 0.015 inches, or in some embodiments, about 0.005 inches. As a result of the seal created between the lower seal 216 and shadow ring 112 and the gap 302 created by the contact of the tip 271 of the spacer pin 232 and the shadow ring 112, gas (e.g., a purge gas) provided by the gas conduit 118 via the opening 224 is forced to flow through the gap 302. In some embodiments, other gases, for example such as inert gases or hydrogen (H$_2$), may be provided to a gap 304 between the heater 106 and substrate 104 via, for example, other conduits or holes (e.g., chucking holes) disposed in the heater 106. In some embodiments, in this position, the gap 304 may be about 0.10 to about 0.30 inches, or in some embodiments, about 0.160 inches, or in some embodiments, about 0.150 inches.

In the position shown in FIG. 3, the heater 106, lower seal 216, and spacer pins 232 remain in the same position relative to one another as shown in the previous position (as depicted in FIG. 2). In addition, in embodiments where the tab 235 is present (such as shown in the figure), in this position, the tab 235 does not contact the extension 237 protruding from the inwardly extending flange 206 of the exhaust 130. In some embodiments, a gap 306 between the tab 235 and flange 206 may be about 0.05 to about 0.1 inches, or in some embodiments, about 0.073 inches. As the heater 106 is raised from the position shown in FIG. 3, the gap 306 decreases until the tab 235 contacts the extension 237. For example, in some embodiments, as the heater is raised such that the distance 308 between the heater 106 and showerhead 108 may be about 0.70 to about 0.80 inches, or in some embodiments, about 0.717 inches the tab 235 contacts the extension 237, thereby preventing the lower seal ring 216 from further upward movement and allowing the heater 106 to continue to be raised independent of the lower seal ring 216.

Figure 4:
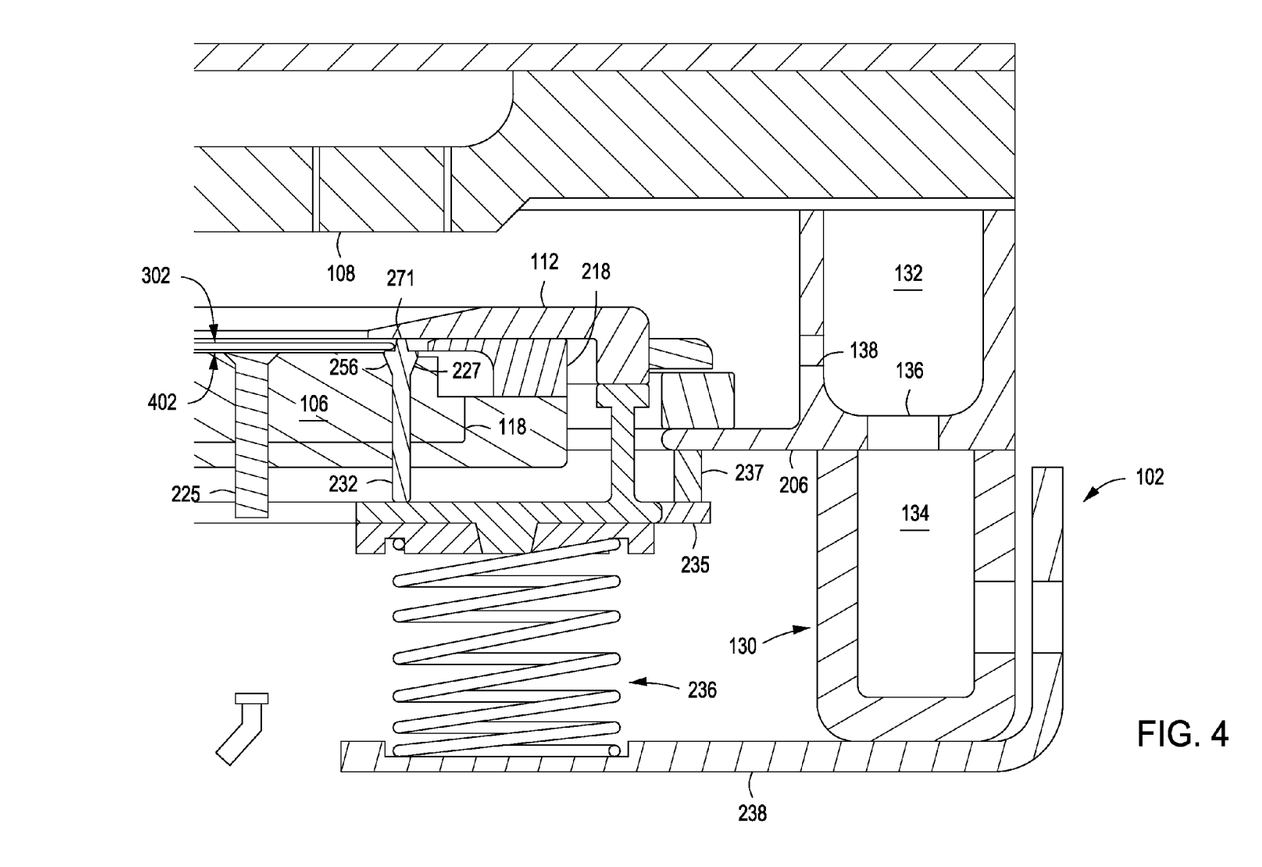
Figure 8:
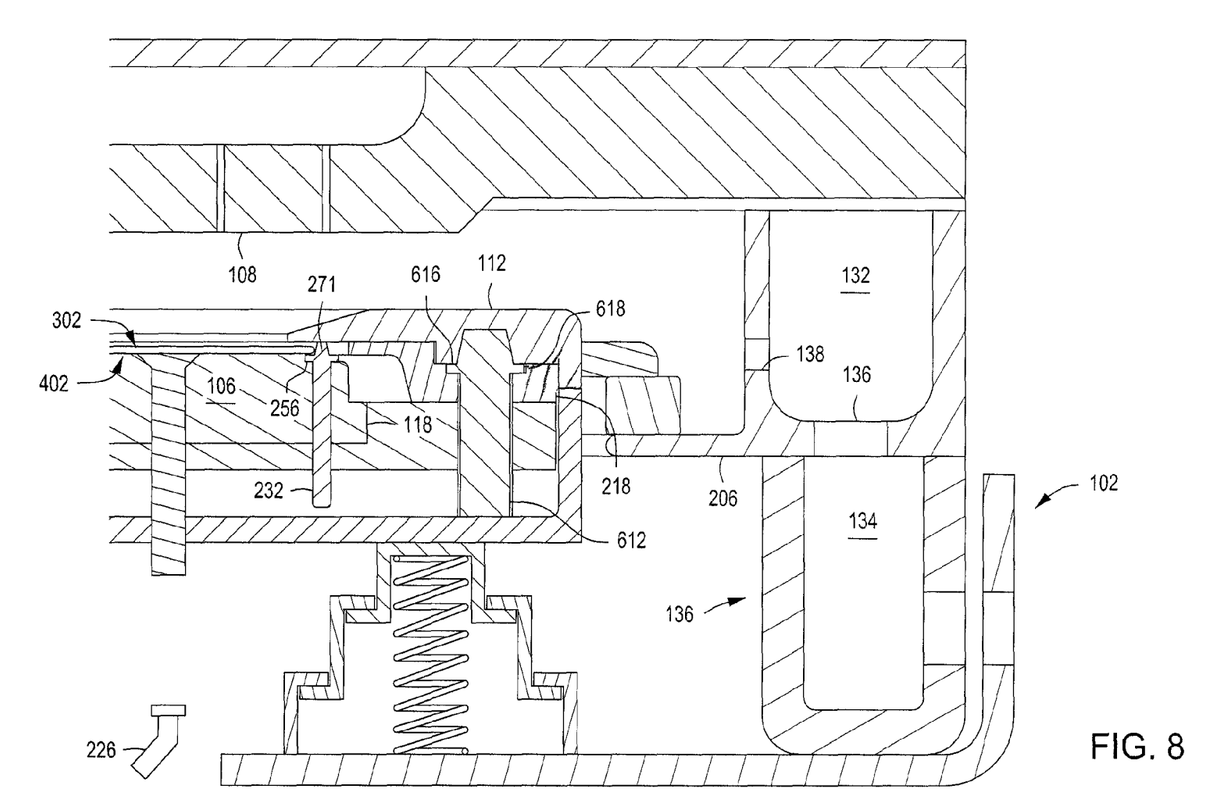

Referring to FIG. 4, as the heater 106 continues to be raised (via, for example, the lift mechanism 115 shown in FIG. 1) from the position shown in FIG. 3, the spacer pins 232 remain stationary as purge ring 218 moves upward and contacts the shadow ring 112. When in contact, the flange 227 of the spacer pin 232 interfaces with the feature 256 of the heater 106, thereby allowing at least a portion of the flange 227 to be recessed. In addition, when present, the flange 616 of the alignment pin 612 interfaces with the feature 618 of the purge ring 218, thereby allowing at least a portion of the flange 227 to be recessed into the purge ring 218, such as shown in FIG. 8.

Referring back to FIG. 4, in this position the lower seal 216, shadow ring 112 and spacer pins 232 remain in the same position as shown in FIG. 3. Accordingly, in this position, a gap 402 between the heater 106 and the substrate 104 decreases while the gap 302 between the substrate and shadow ring 112 remains the same, as compared to the position shown in FIG. 3. As the gap 402 between the heater 106 and substrate 104 decreases, the temperature of the substrate 104 may increase.

Figure 5:
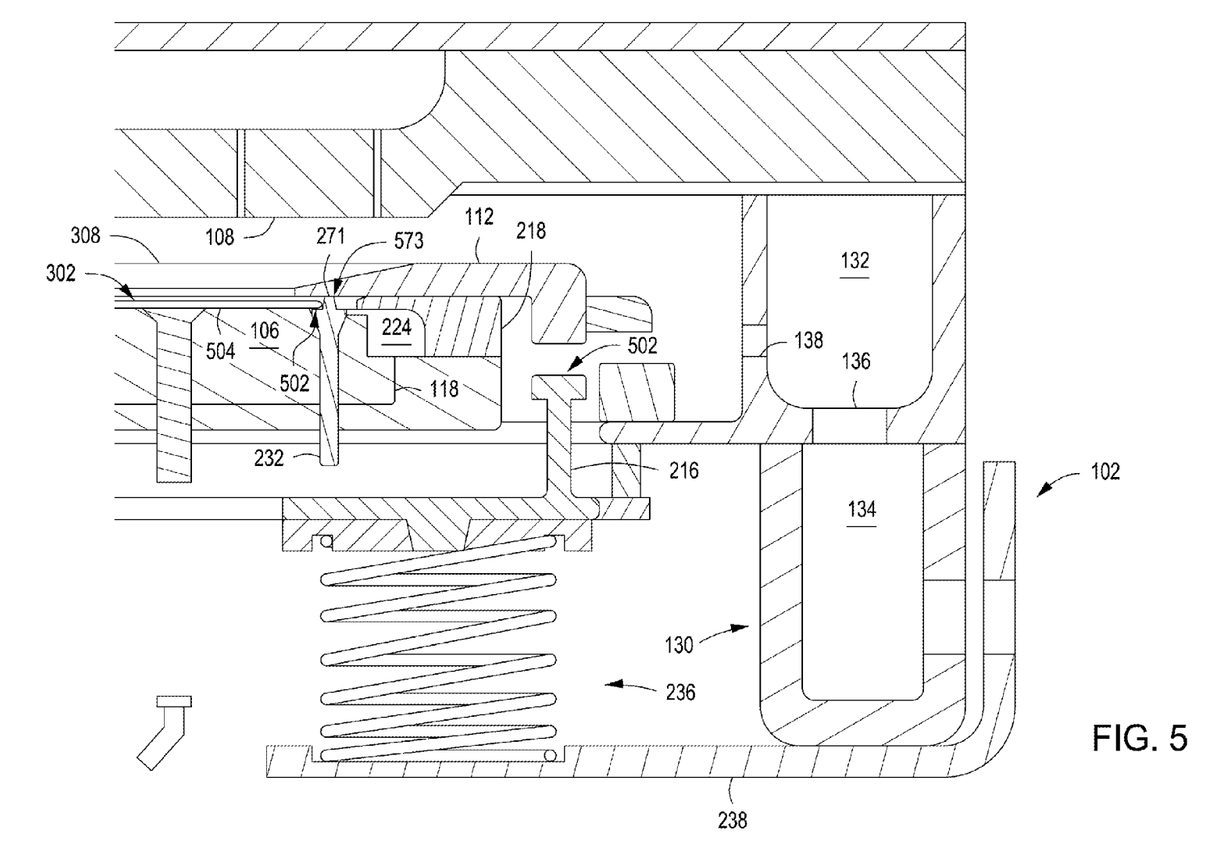

Referring to FIG. 5, as the heater 106 is raised from the position shown in FIG. 4, the spacer pins 232 recess into the heater 106, thereby allowing the substrate 104 to be supported by a top surface 504 of the heater 106. When supported by the heater 106, the substrate 104 temperature increases to a temperature substantially similar to a temperature of the heater 106. In addition, as the as the heater 106 is raised gap 302 between the substrate 104 and shadow ring 112 decreases to a fixed dimension (0.010 in this design, although other designs may have other dimensions).

Figure 9:
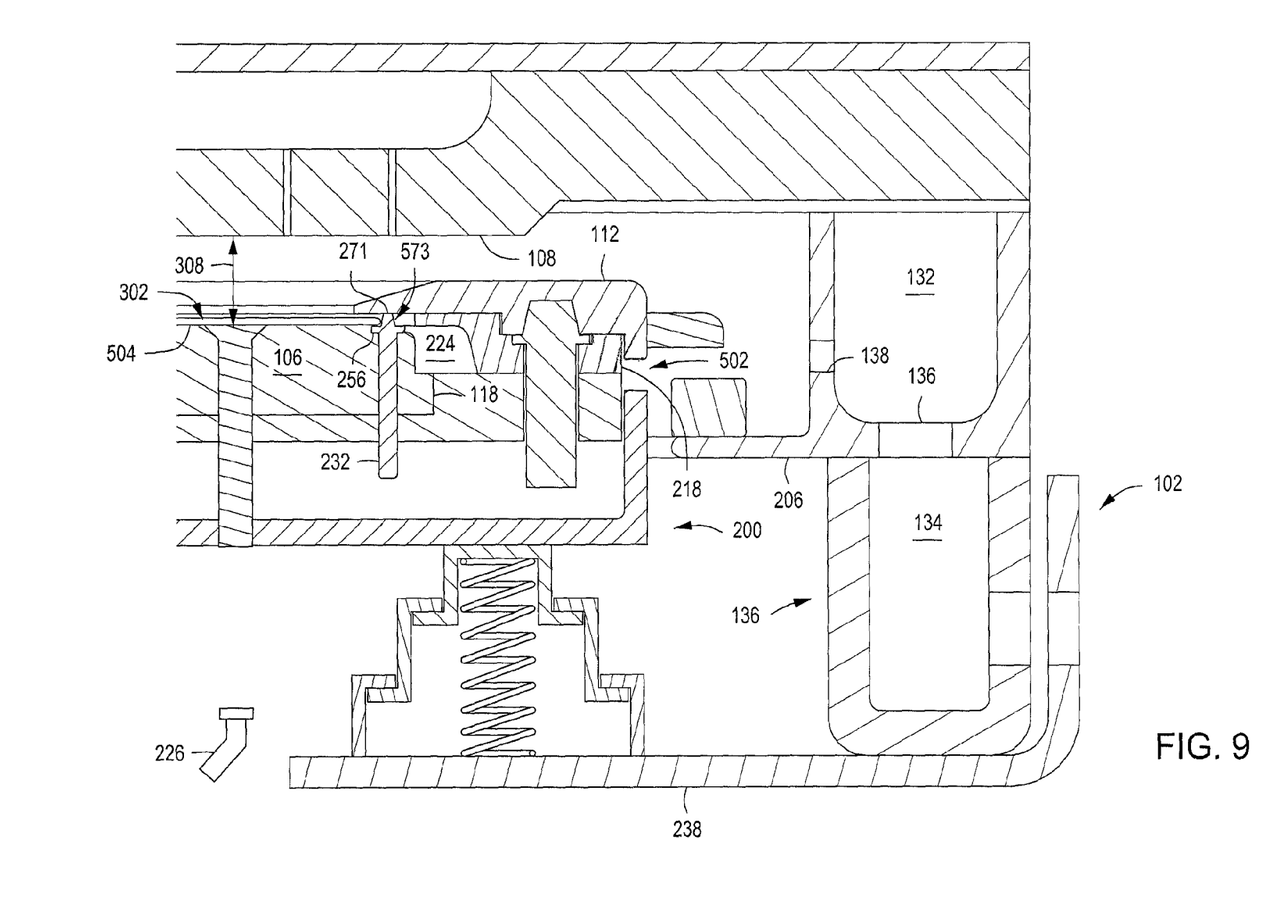

In some embodiments, the spacer pins 232 (and alignment pins 612 when present, such as shown in FIG. 9) are lifted from the lower seal ring 216 and are supported by the heater 106. In addition, as the heater continues to move upwards, the purge ring 218 contacts the shadow ring 112, causing the shadow ring 112 to move away from the lower seal ring 216, thereby creating a gap 502 between the lower seal ring 216 and the shadow ring 112. In addition, the shadow ring 112 moves away from the tip 271 of the lift pin 232 leaving a gap 573 between the shadow ring 112 and tip 271 of the lift pin 232. In some embodiments, during processing of the substrate 104 a gas, for example, such as a purge gas, may continue to flow from the opening 224 through the gap 302. In some embodiments, in the position shown, the distance 308 between the heater 106 and the showerhead 108 may be about 0.100 to about 0.600 inches, or in some embodiments, about 0.400 inches.

Thus, apparatus for variable substrate temperature control has been provided herein. The inventive apparatus may advantageously provide a substrate support that allows for the height of a heater to be controlled in relation to the substrate and/or other components of the process chamber to provide variable substrate temperature process capability. The inventors have discovered that providing variable temperature processing capability may increase process tuning parameters, enhance flexibility of the process and resultant product and provide a more robust process without adding significant cost.

While the foregoing is directed to embodiments of the present invention, other and further embodiments of the invention may be devised without departing from the basic scope thereof.

The invention claimed is:

1. An apparatus for variable substrate temperature control, comprising:
   a heater moveable along a central axis of the apparatus;
   a shadow ring disposed above the heater;
   a seal ring disposed about the heater, the seal ring configured to interface with the shadow ring to form a seal between the seal ring and the shadow ring;
   a plurality of spacer pins configured to support a substrate and disposed within a first set of a plurality of through holes formed in the heater, the plurality of spacer pins moveable parallel to the central axis of the apparatus, wherein the plurality of spacer pins control a first distance between the substrate and the heater and a second distance between the substrate and the shadow ring; and
   a resilient element disposed beneath the seal ring to bias the seal ring toward a backside surface of the heater.

2. The apparatus of claim 1, further comprising:
   a ring disposed on a peripheral edge of the heater, the ring having a top surface configured to interface with a portion of the shadow ring, wherein a top surface of the ring is disposed above a top surface of the heater.

3. The apparatus of claim 2, wherein the ring is configured to form a gap between the ring and the heater, the gap configured to direct a flow of gas to an area proximate the substrate.

4. The apparatus of claim 2, wherein the shadow ring comprises one or more protrusions configured to interface with a corresponding feature formed in the top surface of the ring.

5. The apparatus of claim 1, further comprising:
an outer ring disposed about the shadow ring and configured to support the shadow ring.

6. The apparatus of claim 5, wherein the shadow ring comprises one or more outwardly extending tabs configured to rest atop the outer ring.

7. The apparatus of claim 1, further comprising:
a plurality of alignment pins disposed within a second set of a plurality of through holes formed in the heater and moveable parallel to the central axis, wherein each of the alignment pins comprise an end configured to interface with a corresponding feature of the shadow ring.

8. The apparatus of claim 1, wherein the resilient element is further configured to cause the seal ring to interface with a shadow ring to form the seal.

9. The apparatus of claim 1, wherein each of the plurality of spacer pins comprise an outwardly extending flange to support the substrate and a tip protruding from a first end of the spacer pin, the tip extending above a top surface of the substrate when supported by the flange, wherein the tip is configured to interface with the shadow ring to provide a predetermined gap between the substrate and the shadow ring.

10. The apparatus of claim 1, wherein the first set of plurality of through holes comprise a first end configured to allow the plurality of spacer pins to be recessed beneath a top surface of the heater.

11. A processing system, comprising:
a processing chamber having an inner volume;
an inlet to provide a process gas to the inner volume;
an exhaust disposed in the inner volume to facilitate removal of one or more gases from the process chamber;
a substrate support disposed in the inner volume and below the inlet, wherein the substrate support further comprises:
a heater moveable along a central axis of the substrate support;
a shadow ring disposed above the heater;
a seal ring disposed about the heater, the seal ring configured to interface with the shadow ring to form a seal between the seal ring and the shadow ring;
a plurality of spacer pins configured to support a substrate and disposed within a first set of a plurality of through holes formed in the heater, the plurality of spacer pins moveable parallel to the central axis of the substrate support, wherein the plurality of spacer pins control a first distance between the substrate and the heater and a second distance between the substrate and the shadow ring; and
a resilient element disposed beneath the seal ring to bias the seal ring toward a backside surface of the heater.

12. The processing system of claim 11, further comprising:
a ring disposed on a peripheral edge of the heater, the ring having a top surface configured to interface with a portion of the shadow ring, wherein a top surface of the ring is disposed above a top surface of the heater.

13. The processing system of claim 12, wherein the ring is configured to form a gap between the ring and the heater, the gap configured to direct a flow of gas to an area proximate the substrate.

14. The processing system of claim 12, wherein the shadow ring comprises one or more protrusions configured to interface with a corresponding feature formed in the top surface of the ring.

15. The processing system of claim 11, further comprising:
an outer ring disposed about the shadow ring and supported by an inwardly extending flange of the exhaust.

16. The processing system of claim 15, wherein the shadow ring comprises one or more outwardly extending tabs configured to rest atop the outer ring.

17. The processing system of claim 11, further comprising:
a plurality of alignment pins disposed within a second set of a plurality of through holes formed in the heater and moveable parallel to the central axis of the substrate support, wherein each of the alignment pins comprise an end configured to interface with a corresponding feature of the shadow ring.

18. The processing system of claim 11, wherein the resilient element is further configured to cause the seal ring to interface with a shadow ring to form the seal.

19. The processing system of claim 11, wherein each of the plurality of spacer pins comprise an outwardly extending flange to support the substrate and a tip protruding from a first end of the spacer pin, the tip extending above a top surface of the substrate when supported by the flange, wherein the tip is configured to interface with the shadow ring to provide a predetermined gap between the substrate and the shadow ring.

20. The processing system of claim 11, wherein the first set of plurality of through holes comprise a first end configured to allow the plurality of spacer pins to be recessed beneath a top surface of the heater.

* * * * *